(12) United States Patent
Goto et al.

(10) Patent No.: US 7,220,320 B2
(45) Date of Patent: May 22, 2007

(54) SYSTEMS FOR PRODUCING SEMICONDUCTORS AND MEMBERS THEREFOR

(75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 244 days.

(21) Appl. No.: 10/753,625

(22) Filed: Jan. 8, 2004

(65) Prior Publication Data
US 2004/0144312 A1 Jul. 29, 2004

Related U.S. Application Data

(60) Provisional application No. 60/441,523, filed on Jan. 21, 2003.

(51) Int. Cl.
*H01L 21/00* (2006.01)
*C23C 16/00* (2006.01)
*C23C 14/00* (2006.01)

(52) U.S. Cl. .................... 118/725; 156/345.3; 118/715; 204/298.01

(58) Field of Classification Search ............. 156/345.3, 156/345.52; 118/715, 725; 204/192.1, 298.01; 216/67, 58; 219/76.16
See application file for complete search history.

(56) References Cited

U.S. PATENT DOCUMENTS

| 5,798,016 A * | 8/1998 | Oehrlein et al. ........ 156/345.37 |
| 6,171,438 B1 * | 1/2001 | Masuda et al. ......... 156/345.27 |
| 2001/0054381 A1 * | 12/2001 | Umotoy et al. ............. 118/715 |

FOREIGN PATENT DOCUMENTS

| JP | 05275385 A * | 10/1993 |
| JP | 05-326112 A1 | 12/1993 |
| JP | 2001-274103 | 10/2001 |

* cited by examiner

*Primary Examiner*—Ram N. Kackar
(74) *Attorney, Agent, or Firm*—Burr & Brown

(57) ABSTRACT

The present invention provides members that are provided around a susceptor for mounting a semiconductor in a chamber for a semiconductor production system. Each member has a function of independently generating heat to heat the semiconductor, at least by radiation, and preferably, a heat generating element is embedded in each member.

4 Claims, 7 Drawing Sheets

(a)

(b)

SYSTEMS FOR PRODUCING SEMICONDUCTORS AND MEMBERS THEREFOR

This application is a non-provisional application of U.S. provisional application 60/441,523 filed on Jan. 21, 2003, the entirety of which is incorporated by reference.

BACKGROUND OF THE INVENTION

1. Field of the Invention

The present invention relates to a member for use in a system for producing semiconductors that is provided around a susceptor for mounting a semiconductor in a chamber for producing semiconductors.

2. Related Art Statement

In a semiconductor producing system, the following two methods are known for heating a wafer when a semiconductor thin film is produced on the wafer from gaseous raw materials such as silane gas by means of thermal CVD or the like:

(1) (Indirect heating system)—
   a semiconductor wafer in a chamber is heated with an infrared ray lamp provided outside the chamber; and (2) (Direct heating system)—
   a semiconductor wafer is mounted on a ceramic heater and heated thereon.

According to the indirect heating system, the thermal efficiency of the heating of the susceptor is low. It is thus difficult to elevate the temperature of the susceptor to a high temperature and to improve the temperature uniformity of the susceptor. The direct heating system is widely accepted now.

Multi-zone heaters have been known as ceramic heaters used in the direct heating system. Such a multi-zone heater has a ceramic substrate and inner and outer resistance heat generators made of metals with high melting points embedded within the substrate. Separate power supply terminals are connected to the respective heat generators so that electric power may be applied independently to the respective generators. The inner and outer heat generators may be thus independently controlled.

According to JP-A 5-326112, a resistance heat generator for a ceramic heater includes plural circuit patterns each made of a high melting point metal. The circuit patterns are so arranged that they supplement the defect portions of one another. For example, if one of the patterns has a defect portion such as a folded portion or a returning portion, another circuit pattern is overlapped on or over the defect portion of the one pattern.

For example, in a heater to be used for heating semiconductor wafers, the temperature of the heating surface of the heater needs to be uniformly controlled over the entire surface. It is required that the heater satisfies a severe specification, for example, that the temperature measured on the heating surface is within ±5° C. of the average of the whole heating surface under a use condition.

For example, a ceramic heater with an inner resistance heat generator is produced and electrical power is supplied to the heat generator so that the average temperature of the heating surface reaches a desired target value. It is now provided that the temperature over the heating surface is within a desired range after the average temperature reaches the target value. Even in this case, however, the temperature distribution on the heating surface may be substantially changed after the heater is actually fixed in a chamber. Such a change in the temperature distribution depends on various conditions, for example, when a fitting is used to fix a ceramic heater on the wall of a chamber, and the area and shape of the surface region of the heater that contacts the fitting may affect the temperature distribution. In addition to this, the temperature distribution may be affected by the thermal capacity of the fitting, the shape and thermal capacity of a chamber, thermal reflection and absorption on the inner wall surface of a chamber, and the pressures and gas flow inside and outside of a chamber.

Even when the heating surface of a ceramic heater has a desired temperature uniformity before the heater is fixed in a chamber, the temperature distribution may be out of the desired uniformity after the heater is fixed in the chamber, as explained above.

Two-zone heaters, as described above, may be effective for changing the average temperatures of the outer and inner portions of the heating surface, respectively and independently. In such a two-zone heater, however, hot spots or cold spots may be observed in only a part of the heating surface, after the two-zone ceramic heater is fixed in a chamber. The two-zone control system is not effective for reducing such cold and hot spots observed in only a small part of the heating surface.

The inventors also considered a system including a ceramic heater divided into many zones and having separate resistance heat generators provided in each corresponding with each of the zones. The electric power to the heating elements is independently controlled. When a cold spot is observed in one of the zones of the heating surface, it is effective to increase the electric power supplied to the heat generator corresponding to the zone with the observed cold spot. Such an increased electric power to the zone improves the heat generation so that the cold spot may be reduced or cancelled.

The inventors have investigated this idea, however, and finally found that the control is also ineffective for reducing the temperature distribution. That is, the temperature of each zone of the heating surface is influenced by the heat generation right under the zone, as well as the heat generation by other heat generators provided right under another zones, respectively. The temperature distribution on the heating surface is determined by many factors including heat generated from each heat generator, the shape, dimension and thermal capacity of the ceramic substrate, and the temperature, pressure and gas flow around the substrate. Such factors may affect each other. It is possible to reduce or cancel a cold spot by increasing the electric power supplied to a heat generator corresponding with the zone with the observed cold spot. In this case, however, the heat generated from the heating element right under the cold spot is transmitted to the adjacent zones, so that the total balance of heat generation and transfer in the substrate and the temperature distribution on the heating surface may be changed. Such a change in the balance of the heat generation and transfer may generate a hot spot on the heating surface or increase the average temperature of the surface. When the average temperature of the heating surface is increased, it is necessary to reduce the electric power supplied to other heat generators provided for other zones. Such a reduction of the electric power supplied to other heat generators may induce other cold spots on the heating surface. The difference between the maximum and minimum temperatures on the heating surface may be thus increased in many cases by canceling one cold spot.

An object of the present invention is to provide a method of heating a semiconductor on a susceptor in a chamber, in which the temperature distribution on the susceptor can be reduced even when the target temperature of the susceptor is high.

SUMMARY OF THE INVENTION

The present invention provides a member that is provided around a susceptor for mounting a semiconductor in a chamber for a semiconductor production system, the member comprising a function of generating heat by itself.

The present invention further provides a system for producing semiconductors having a chamber, a susceptor for mounting semiconductor, and the above member provided around the susceptor.

The inventors have studied the cause of deviations in the temperature distribution on the surface of a susceptor, such as cold and hot spots, and have reached the following discovery. For example, it is provided that a metal heat generating wire is embedded in a ceramic susceptor to produce a ceramic heater. When electric power is supplied to the wire in the heater to generate heat, the supplied electric power and the uniformity of temperature on the heating face of the heater are correlated with each other. That is, as the electric power is smaller, the uniformity of temperature on the heating face of the heater and semiconductor wafer thereon is better, provided that the target temperature on the heating face is not changed. The reasons would be as follows. In any heater, the heat generator therein has local distribution of resistance and deviation of thermal resistance between the heat generator and ceramic material. As the electric power supply to the heat generator is larger, the influence of the local distribution of resistance of the heat generator as well as the deviation of thermal resistance between the heat generator and ceramic material on the temperature uniformity on the heating face is more considerable. The temperature uniformity on the heating face may be adversely affected to result in cold and hot spots. It is thus desired to reduce supplied electric power required for attaining the target temperature on the heating face.

According to the inventors' study, a substantial portion of electric power supplied to the ceramic heater is not utilized for convection heating of a semiconductor wafer, which is a major purpose, resulting in a substantial heat loss from the heater to the outside thereof. The electric power supply to the heat generator required for attaining a predetermined target temperature becomes large. It is thus difficult to attain uniform temperature distribution on the heating face of The heat loss from the heater, which is not utilized for convection heating of the wafer, includes the following:

(1) Thermal transmission from the heater substrate to atmosphere in a chamber;
(2) Thermal conduction from the heater substrate to a cooling portion of an end of a shaft (a member for supporting the heater); and
(3) Heat transfer by radiation from the heater substrate to a member (for example a gas supply plate or liner) in a chamber.

Since the distance between the member in the chamber and heater is relatively small and the member has a low surface temperature, the effect (3) of the heat transfer by radiation toward the member in a chamber proved to be largest. Based on the discovery, the inventors have reached the idea of providing a function of heat generation by itself to the member in a chamber, so that the member supplies heat by radiation to a semiconductor mounted on the susceptor. It is thus provided a novel heating system for improving the temperature uniformity of the semiconductor mounted on the susceptor.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 2 (*b*) is a diagram showing a planar pattern of gas holes 3*a* and heat generating elements 15 in a gas supply plate 3.

FIG. 3 (*b*) is an enlarged view showing a connecting part of a terminal 14 and a heat generating element 15.

DETAILED DESCRIPTION OF THE INVENTION

The present invention will be described further in detail, referring to the attached drawings.

Figure 1:
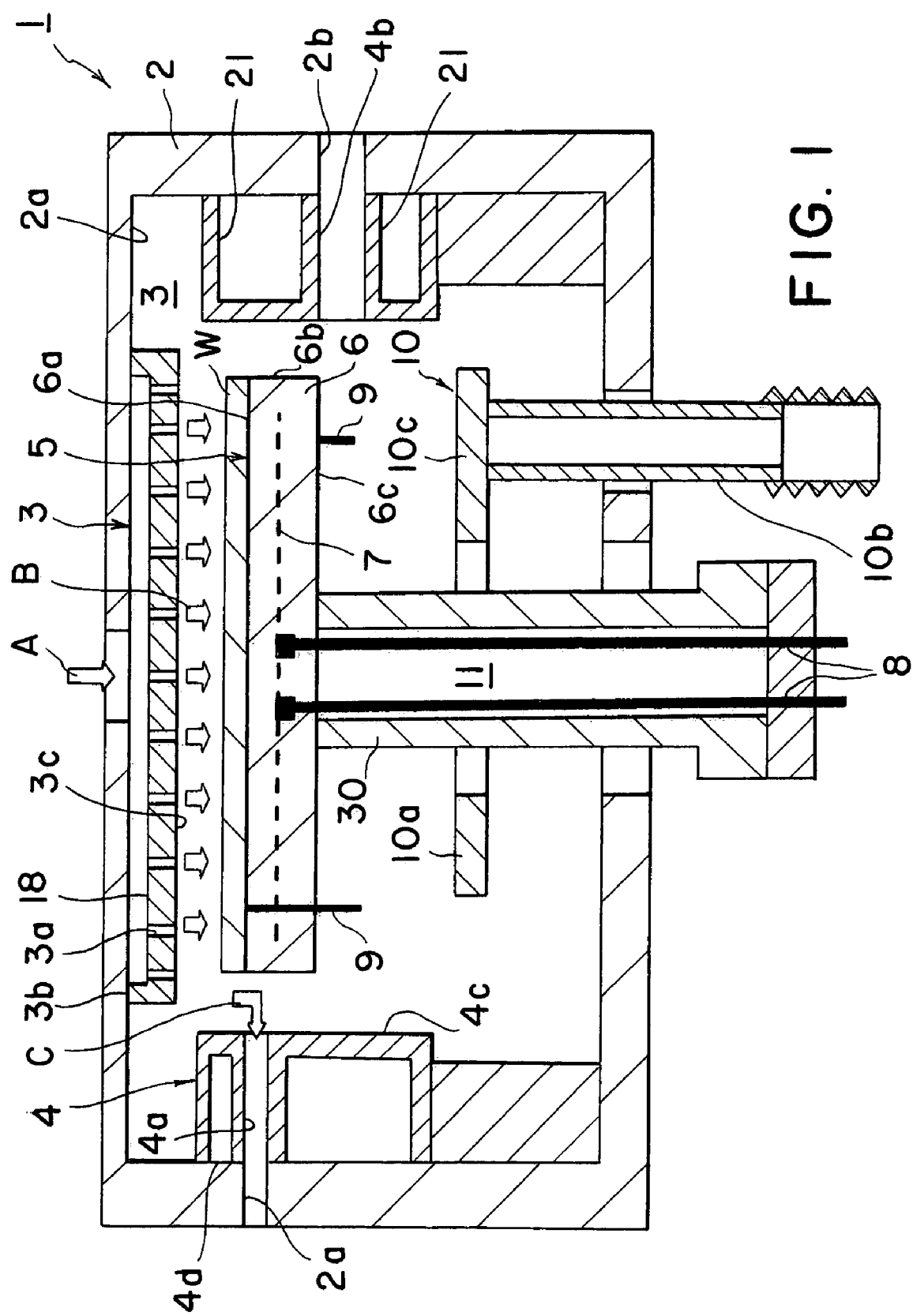
FIG. 1 is a cross sectional view schematically showing a system 1 for producing semiconductors according to one embodiment of the present invention.

FIG. 1 is a cross sectional view schematically showing a system 1 for producing semiconductors according to the present invention. In the system 1 of the present example, a susceptor 5 is fixed in a chamber 2. The susceptor 5 has a substrate 6 and a heat generating element 7 embedded in the substrate 6. A semiconductor wafer W is mounted on a heating face 6*a* of the substrate 6. Elevating pins 9 are inserted in the substrate 6. A cylindrical supporting member (shaft) 30 is joined with a back face 6*c* of the substrate 6. Electric power supplying members 8 are inserted and fixed in an inner space 11 of a supporting member 30.

Figure 2:
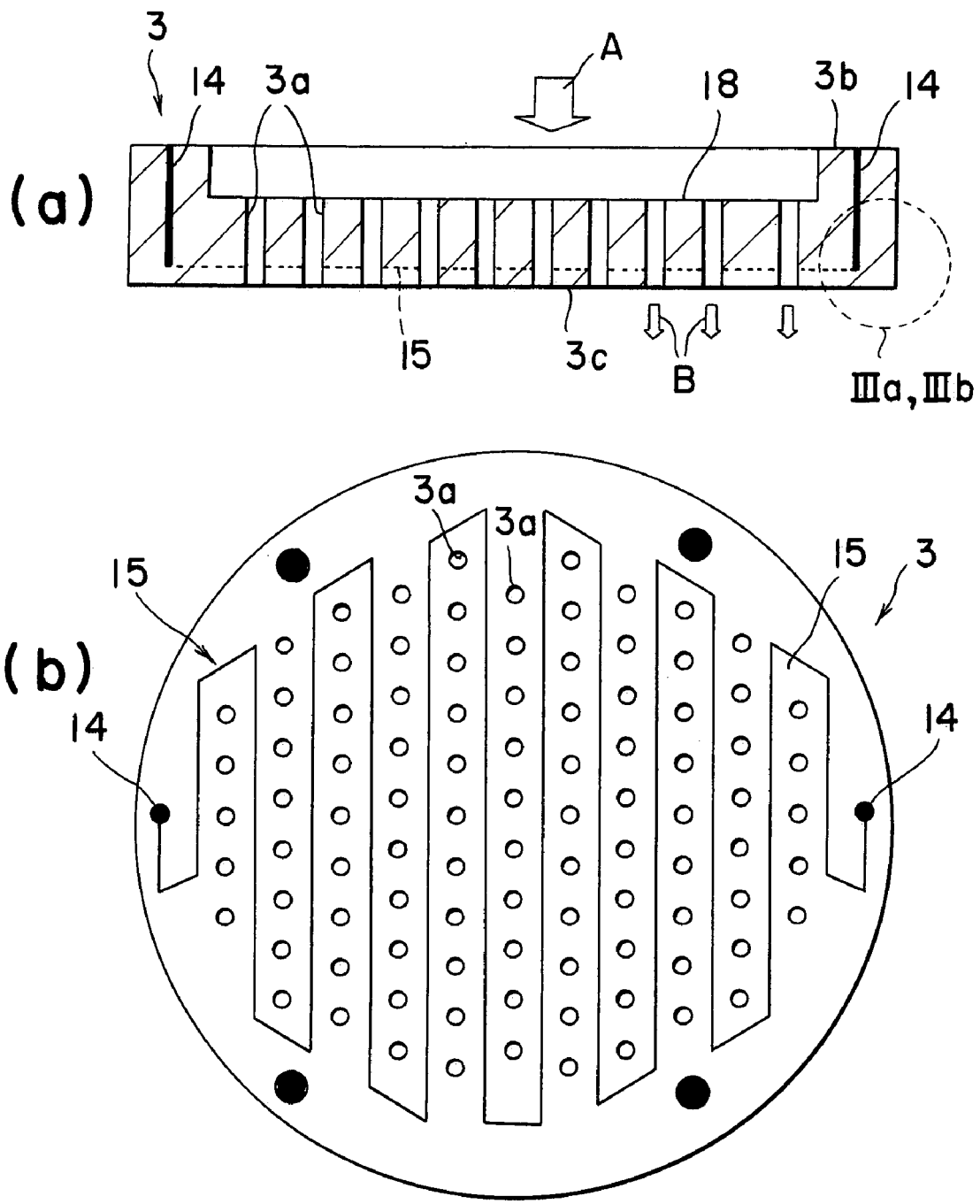
FIG. 2 (*a*) is a cross sectional view schematically showing a gas supply plate 3.

In the present example, the invention is applied to the lifter 10 for an elevating pin, liner 4 and gas supply plate 3. That is, the gas supply plate 3 is fixed at a position opposing the semiconductor wafer W. FIG. 2(*a*) is a cross sectional view schematically showing the gas supply plate 3 according to the present example, and FIG. 2 (*b*) is a diagram showing planar pattern of gas holes 3*a* and heat generating element 1. The detail of the gas supply plate 3 is not shown in FIG. 1.

Many gas holes 3*a* are provided in the gas supply plate 3. A circular recess 18 is formed on the back face 3*b* of the gas supply plate 3. When a gas is supplied from the side of the back face 3*b* of the gas supply plate 3 as an arrow "A", the gas is then distributed into the gas holes 3*a* and discharged from the gas holes 3*a* as arrows "B" toward the wafer W.

In the present example, the heat generating element 15 is embedded in a substrate of the gas supply plate 15, so that electric power is supplied through terminals 14 to the heat generating element 15 to generate heat from the element. The heat generating element 15 supplies heat to the substrate of the gas supply plate 3 by means of convection heat transfer, so that the opposing face 3c of the gas supply plate 3 heats the wafer W by heat radiation.

Figure 3:
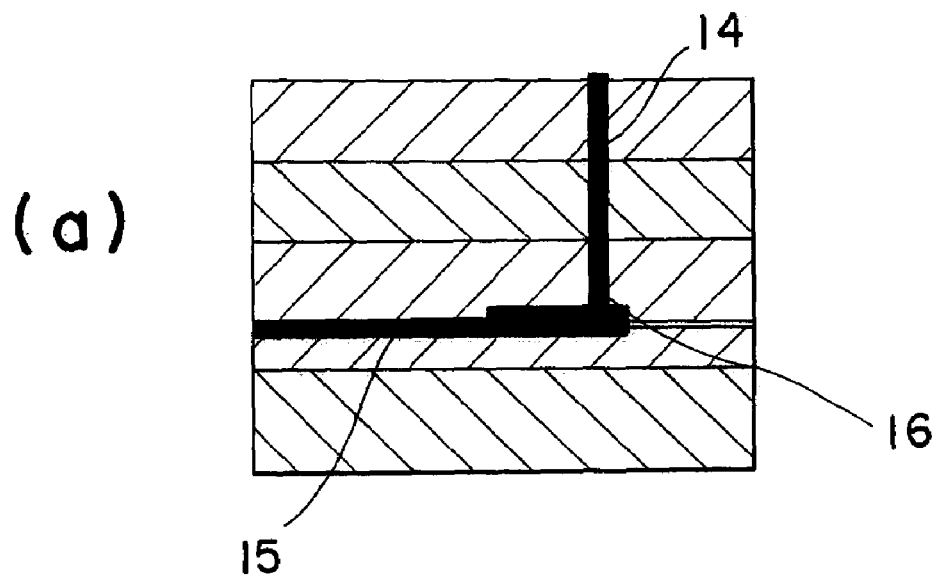
FIG. 3 (*a*) is an enlarged view showing a connecting part of a terminal 14 and a heat generating element 15.
Figure 3:
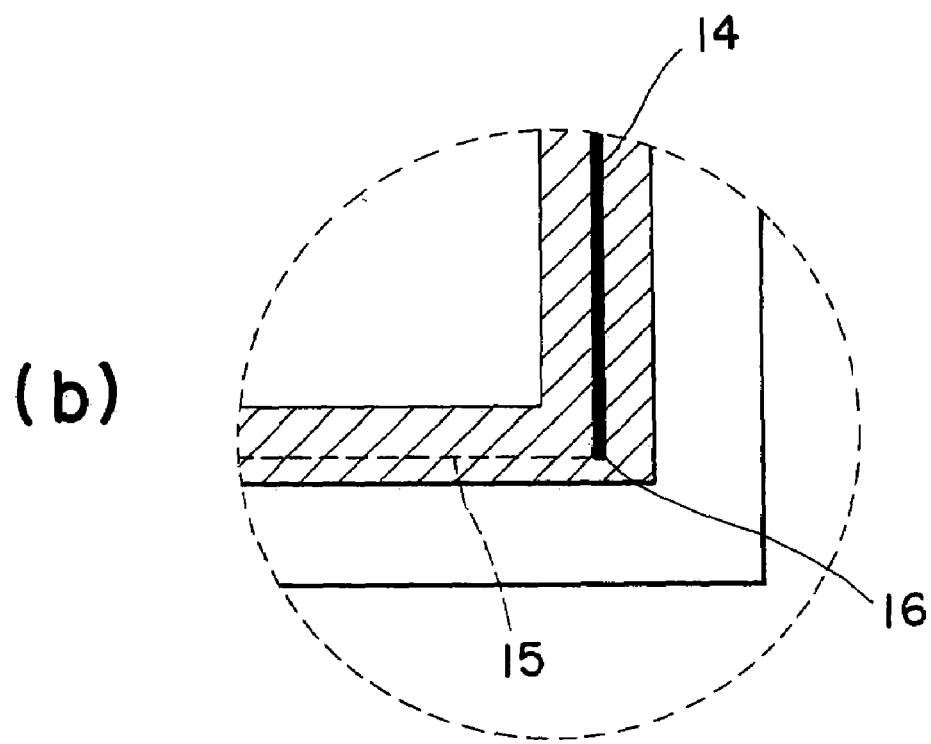

In the present example, the terminal 14 and heat generating element 15 may be connected through a connecting part, for example, shown in FIGS. 3 (a) and 3(b). In the example shown in FIG. 3 (a), a lead wire is used as the terminal 14, and the lead wire 14 and heat generating element 15 are soldered with each other by a soldering agent. Also in the example shown in FIG. 3 (b), a lead wire is used as the terminal 14. The lead wire 14 and heat generating element 15 are joined with each other by means of welding or caulking 16 (connection by a pressure due to the mechanical deformation of the wire 14 and element 15).

Figure 4:
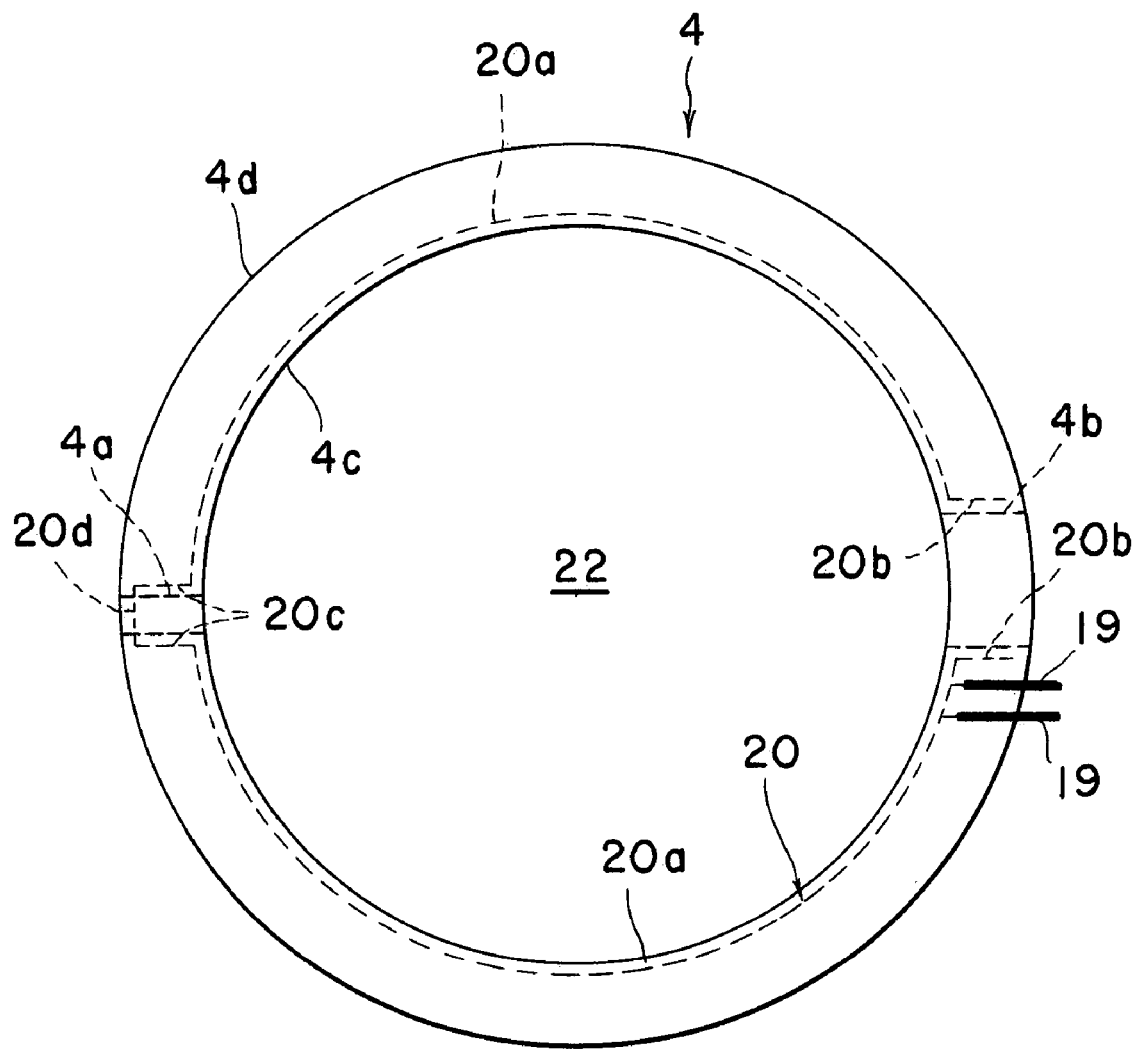
FIG. 4 is a plan view showing a liner 4.
Figure 5:
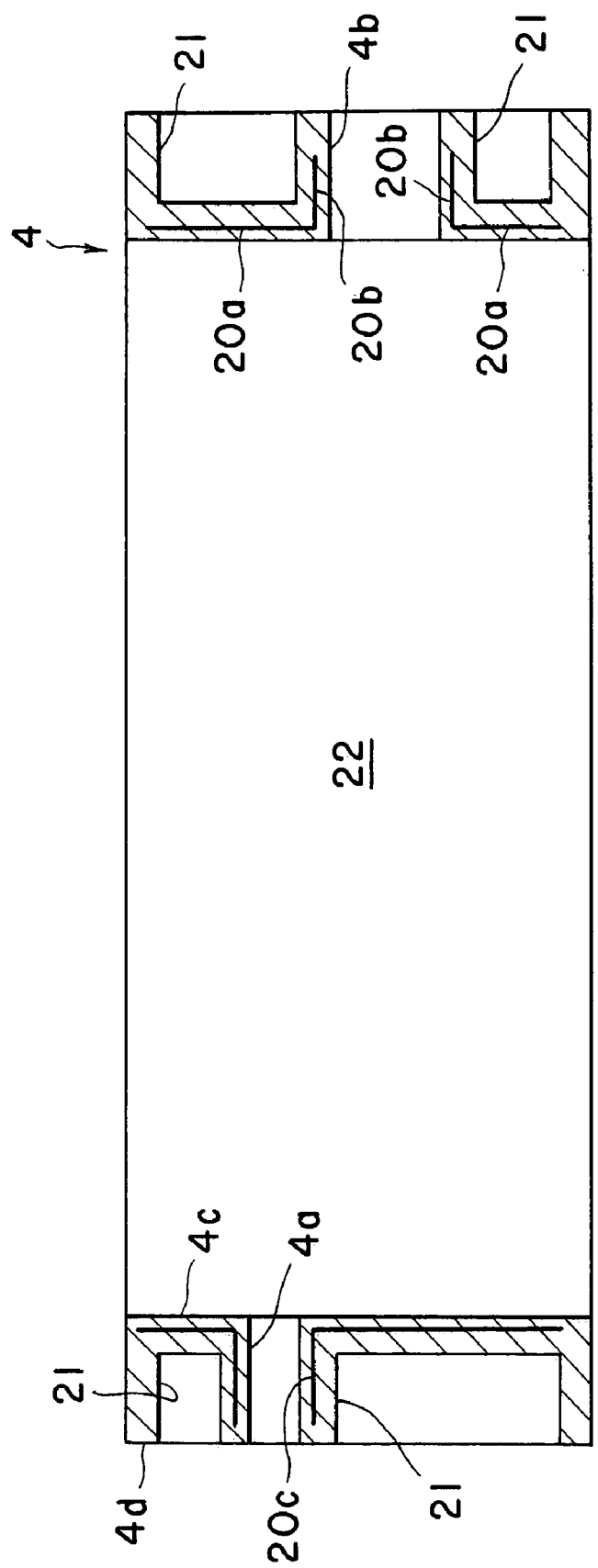
FIG. 5 is a cross sectional view showing a liner 4.

Further in the present example, a heat generating element is provided in the liner 4. That is, FIG. 4 is a plan view showing a liner 4 according to the present example, and FIG. 5 is a cross sectional view showing the liner 4. The liner 4 substantially has a ring-shape in a plan view. A recess 22 substantially having a shape of a circle is formed inside of the liner 4. The susceptor and wafer are contained in and surrounded by the recess 22. A gas supply hole 4a and a hole for supplying a wafer 4b are provided between the outer surface 4d and opposing face 4c of the liner 4.

In the present example, a heat generating element 20 is embedded particularly in the side of the opposing face 4c of the liner 4. The heat generating element 20 has a main part 20a extending along the opposing face 4c, an opening heating part 20c provided at a position opposing the gas discharge hole 4a, and an opening heating part 20b provided at a position opposing the hole 4b for supplying wafer. 20d represents a connecting part. 20d may function as a heating element, or may be a lead wire substantially free from heat generation. Electric power may be supplied to the end of the heat generating element 20 through, for example, a pair of terminals 19. The terminal 19 and heat generating element 20 are preferably connected with each other by means of connecting parts, for example, as shown in FIGS. 3(a) and 3(b). In the present example, a recess 21 is provided facing the side of the outer surface (face mounted on the inner surface of the chamber) 4d of the liner 4.

The susceptor 5, especially the side face 6b can be heated by heat transfer through radiation from the liner 4. It is possible to prevent the outer peripheral part of the heating face from experiencing a temperature drop due to heat radiation from the side wall face of the susceptor 5 and is thus preferred.

Figure 6:
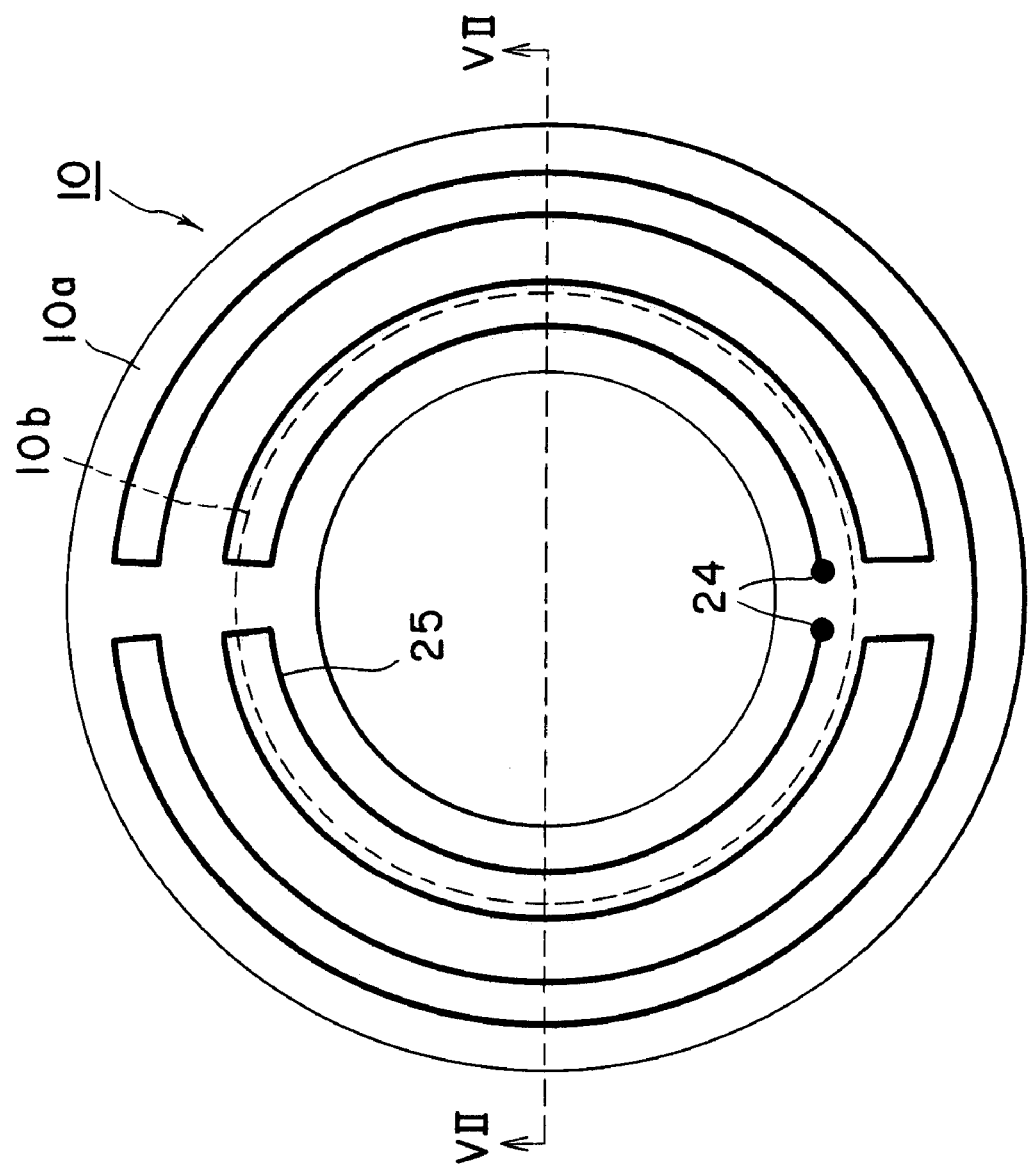
FIG. 6 is a diagram showing planar patter of a heat generating element 25 in a lifter 10 for an elevating pin.
Figure 7:
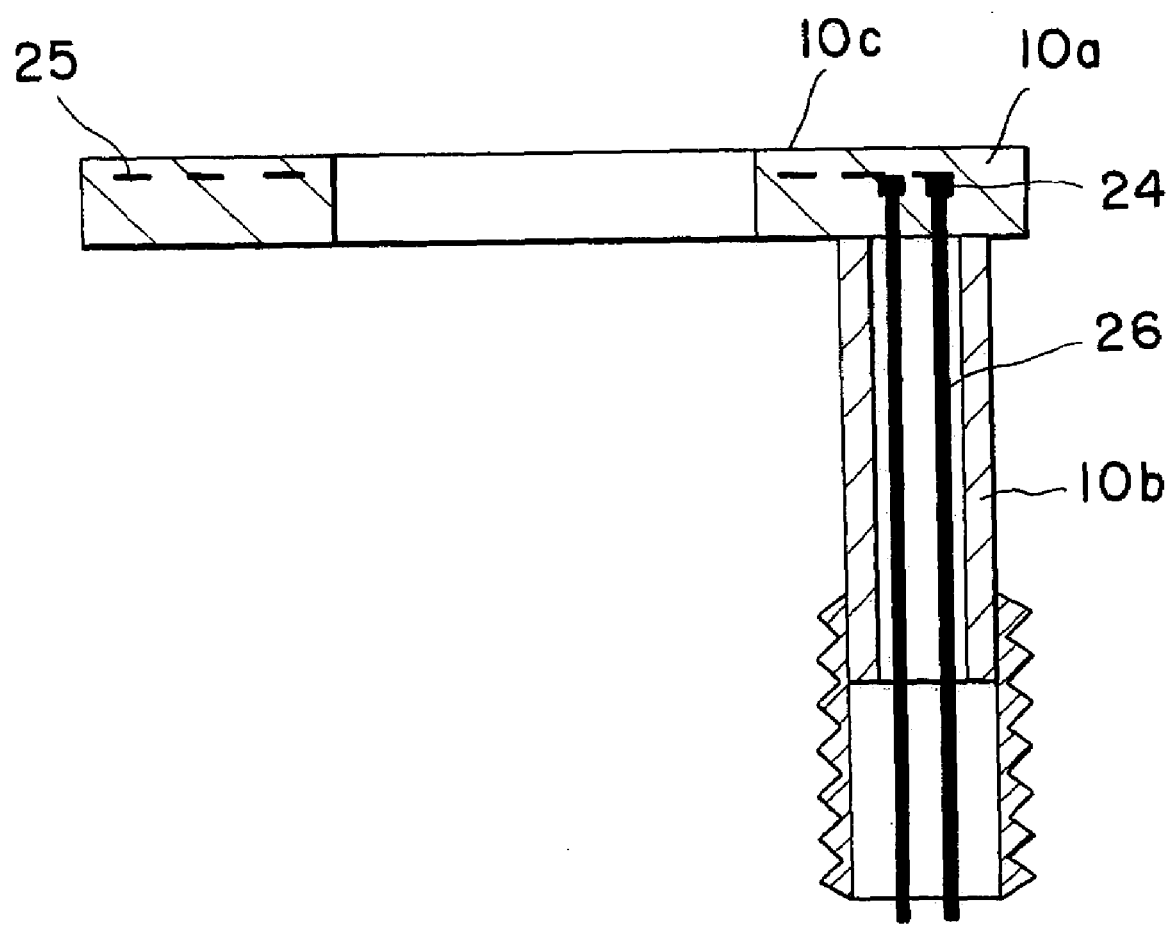
FIG. 7 is a cross sectional view schematically showing a lifter 10 for an elevating pin.

Further, in the present example, a heat generator may be provided in the lifter 10 for elevating pin. FIG. 6 is a diagram showing a planar pattern of a heat generating element 25 in such a lifter 10 for an elevating pin. FIG. 7 is a cross sectional view showing the lifter 10 for an elevating pin. The lifter 10 has a ring-shaped lift part 10a, and a cylindrical supporting part 10b attached on the back face of the lift part 10a. The heat generating element 25 is embedded in the side of opposing face 10c of the lift part 10a, and connected to a terminal 24. Each terminal 24 is connected to an electric supply member 26 inside of the supporting part 10b. Electric power is supplied to the heat generating element 25 so that the opposing face 10c of the lift part 10a heat the susceptor W and susceptor 5 by radiation.

According to the present example, each of the members 3, 4 and 10 in the chamber has the function of independent heat generation, so that the semiconductor W on the susceptor can be heated by means of heat radiation from each member. As described earlier, the temperature distribution on the heating face 6a and semiconductor W may be deteriorated due to heat radiation from the susceptor to the members. According to the present example, it is possible to prevent such deterioration of temperature distribution and thus to provide a novel heating system for improving the uniformity of temperature of the semiconductor mounted on the susceptor.

The following additional advantages may be obtained, according to the present example. When a film is deposited on the surface of the susceptor 5 or the other member in the chamber over time, or when the surface roughness is changed due to corrosion, the conditions for heat radiation from the susceptor to atmosphere in the chamber and member therein are changed. The temperature distribution on the heating face of the susceptor tends to be increased. Even in this case, however, it is possible to increase or decrease the supplied electric power to the heat generating element of each member to cancel the effect of the change of the heat radiation condition from the susceptor to the member in the chamber. Increases in the temperature distribution on the heating face can be thus prevented, according to the present invention.

The effect of the heat radiation from the member in the chamber is most considerable at a temperature of 400° C. or higher. In a preferred embodiment, the target temperature of the semiconductor is set at 400° C. or higher.

Further, the advantageous effects of the present invention are most considerable when the distances of the opposing faces 3c, 4c and 10c of the member in the chamber and the susceptor 5 are preferably 300 mm or smaller, and more preferably 50 mm or smaller.

The members according to the present invention are members to be provided around a susceptor in a chamber of a system for producing semiconductors.

The member of the present invention has a function of providing independent heat generation. The mechanism of the heat generation is not particularly limited. The whole member may generate heat, or the member may have a substrate and heat generating element. It is preferred that a heat generating element is embedded in a substrate for minimizing the effects on semiconductors.

The material of the member of the present invention is not particularly limited and may preferably be a corrosion resistant ceramics or corrosion resistant metal. More preferably, the material is an alloy of aluminum, an alloy of nickel, an aluminum series ceramics such as alumina, aluminum nitride or the like, or a silicon series ceramics such as silicon nitride, silicon carbide, quartz, silica glass and the like.

In a preferred embodiment, the heat generating element has a sheath heater inserted in a substrate composed of an alloy of aluminum. When the sheath heater is used, its heat generator is covered with an insulating material to prevent leakage current from the heat generator to the aluminum alloy.

In a preferred embodiment, the substrate comprises a corrosion resistant ceramic. In this case, the heat generating element may be composed of a printed metal paste, metal foil or metal wire. When the heat generating element is made of a metal paste, a ceramic plate having the metal paste may be shaped by various shaping methods such as doctor blade molding. Alternatively, when the heat generating element is composed of a metal foil or metal wire, the ceramic may preferably be produced by sintering using hot pressing or hot isostatic pressing. In the member according to the present invention, a metal element other than the heat generating element may also be fixed or embedded therein. Such a metal element includes an electrode for high frequency for generating plasma.

In the case of the liner 4, heat may be easily discharged through the inserting hole 2b for wafer and discharge hole 2a. It is thus preferred to provide heat generating elements 20b and 20c around the holes 2a and 2b, respectively.

The system for producing semiconductors is a system for use in any process for producing semiconductors including cleaning, etching, testing or the like.

According to the present invention, heat generation from the susceptor 5 is not indispensable. It is, however, preferred to generate heat from the susceptor 5 for further elevating the temperature of the semiconductor mounted on the susceptor. In this case, a ratio (P/S) of the supplied energy "S" (W) to the susceptor 5 to the total "P" (W) of the supplied energy/energies to the member(s) may preferably be 0.1 to 10. The ratio (P/S) may more preferably be 0.5 to 3.0.

EXAMPLES

Comparative Example 1

A heat generating wire 7 made of a molybdenum coil spring was embedded in a sintered aluminum nitride body to obtain a heater 5. The heater 5 was fixed to a chamber 2 using a ceramic supporting member 30. Further, a gas supply plate, liner and lifter for elevating pin were contained and fixed in the chamber 2. Each of these members do not have a heat generating element therein.

Electric power of about 2000 W was supplied to a heat generating element 7 in the heater 5 to heat a semiconductor wafer W. The target temperature for the wafer W was set at 700° C. Seventeen points on the surface of the wafer were measured for temperature by means of a radiation thermometer to obtain the maximum and minimum temperatures. The difference between the maximum and minimum temperatures was calculated and is shown in Table 1.

TABLE 1

|  |  | Comparative Example 1 | Example 1 |
| --- | --- | --- | --- |
| Supplied power to heat generating element (W) | Gas supply plate 3 | 0 | 200 |
|  | Liner 4 | 0 | 600 |
|  | Lifter 10 for Elevating pin | 0 | 600 |
|  | Susceptor 5 | 2000 | 600 |
| Difference of the maximum and minimum Temperatures of wafer W (° C.) |  | 15° C. | 5° C. |

According to Comparative Example 1, the difference between the maximum and minimum temperatures on the wafer can be reduced to about 15° C. at the target temperature of 700° C.

Inventive Example 1

The temperature difference on the wafer was measured according to the same procedure as that in Comparative Example 1. In Inventive Example 1, however, the gas supply plate 3, liner 4 and lifter 10 for the elevating pin shown in FIGS. 2 to 7 were provided with electric power supplied to the heat generating elements. The supplied power to each of the heat generating elements is shown in Table 1. The total power supplied to the elements was about 2000 W.

As a result, it was shown that the temperature difference on the wafer W can be reduced to about 5° C. when power is supplied to the heater (susceptor) 5 at about 600 W and the total power supplied to the other members is about 1400 W. It was thus found that a substantial portion of the power supplied to the susceptor 5 in Comparative Example 1 was radiated to the gas supply plate, liner and the lifter for the elevating pin which resulted in a thermal loss. It was thus necessary to supply a large amount of power to the susceptor to compensate for the thermal loss in Comparative Example 1, so that cold and hot spots may be easily observed on the heating face. On the contrary, the power necessary for attaining the target temperature supplied to the susceptor can be reduced to 600 W in the Inventive Example 1. It was thus possible to reduce cold and hot spots on the heating face and to reduce the temperature difference on the wafer.

As described above, the present invention provides a method of heating a semiconductor on a susceptor in a chamber, in which the temperature distribution on the susceptor can be reduced even when the target temperature of the susceptor is high.

The present invention has been explained referring to the preferred embodiments. However, the present invention is not limited to the illustrated embodiments which are given by way of examples only, and may be carried out in various modes without departing from the scope of the invention.

The invention claimed is:

1. A member provided around a peripheral side face of a susceptor for mounting a semiconductor in a chamber for a semiconductor production system, said member comprising a substrate, a heat generating element embedded in said substrate and surrounding the peripheral side face of the susceptor, at least one recess, circumscribing an outer peripheral surface of said member, formed between said outer peripheral surface of said member and an inner surface of a wall of the chamber, a gas hole passing through the chamber wall and through said member, and a wafer supply hole vertically off-set from said gas hole and passing through the chamber wall and through a portion of said member opposing said gas hole, wherein said member generates heat by electric power to heat the semiconductor at least via radiant heat transfer.

2. A liner comprising the member of claim 1.

3. A system for producing semiconductors comprising a chamber, a susceptor for mounting a semiconductor, and said member of claim 1 provided around said susceptor so that said outer peripheral surface of said member contacts an inner wall surface of said chamber.

4. The member of claim 1, wherein at least a portion of said embedded heat generating element circumscribes a surface of said gas hole and a surface of said wafer supply hole.

* * * * *

UNITED STATES PATENT AND TRADEMARK OFFICE
CERTIFICATE OF CORRECTION

| | | |
|---|---|---|
| PATENT NO. | : 7,220,320 B2 | Page 1 of 1 |
| APPLICATION NO. | : 10/753625 | |
| DATED | : May 22, 2007 | |
| INVENTOR(S) | : Yoshinobu Goto and Hideyoshi Tsuruta | |

It is certified that error appears in the above-identified patent and that said Letters Patent is hereby corrected as shown below:

Column 8

Line 42:　add --inlet-- before "hole" and add --straight-- before "through"

Signed and Sealed this

Thirty-first Day of July, 2007

JON W. DUDAS
*Director of the United States Patent and Trademark Office*